(12) United States Patent
Muegge et al.

(10) Patent No.: US 10,290,471 B2
(45) Date of Patent: May 14, 2019

(54) DEVICE FOR GENERATING PLASMA BY MEANS OF MICROWAVES

(75) Inventors: Horst Muegge, Weinheim (DE); Klaus-Martin Baumgärtner, Fränkisch-Crumbach (DE); Mathias Kaiser, Karlsbad (DE); Lukas Alberts, Ludwigsburg (DE)

(73) Assignee: Muegge GmbH, Reichelsheim (DE)

( * ) Notice: Subject to any disclaimer, the term of this patent is extended or adjusted under 35 U.S.C. 154(b) by 1325 days.

(21) Appl. No.: 13/509,290

(22) PCT Filed: Nov. 5, 2010

(86) PCT No.: PCT/EP2010/066953
§ 371 (c)(1),
(2), (4) Date: Jul. 19, 2012

(87) PCT Pub. No.: WO2011/064084
PCT Pub. Date: Jun. 3, 2011

(65) Prior Publication Data
US 2012/0279448 A1      Nov. 8, 2012

(30) Foreign Application Priority Data

Nov. 11, 2009   (DE) .................. 10 2009 044 496

(51) Int. Cl.
*C23C 16/00*      (2006.01)
*C23F 1/00*       (2006.01)
(Continued)

(52) U.S. Cl.
CPC ... *H01J 37/32211* (2013.01); *H01J 37/32192* (2013.01); *C23C 16/511* (2013.01)

(58) Field of Classification Search
CPC .......... H01J 37/32192–37/32311; H05H 1/46; H05H 2001/4607–2001/4637; C23C 16/511
(Continued)

(56) References Cited

U.S. PATENT DOCUMENTS 4,515,107 A * 5/1985 Fournier et al. .............. 118/718
5,017,404 A   5/1991 Paquet et al.
(Continued)

FOREIGN PATENT DOCUMENTS

DE      19503205 C1    7/1996
EP       1063678 A2   12/2000
(Continued)

OTHER PUBLICATIONS

English Machine Translation JP2002339074, Yoshida et al dt Nov. 27, 2002.*
(Continued)

*Primary Examiner* — Rakesh K Dhingra
(74) *Attorney, Agent, or Firm* — WRB-IP LLP

(57) ABSTRACT

A device is provided for generating plasma by microwaves for CVD coating a substrate having a vacuum container into which a reaction gas can be fed and an electrical conductor arranged therein which is connected on each of both ends thereof to a device for coupling microwaves and to a voltage source with which a difference of potential can generated between the electrical conductor and the surrounding vacuum container. The electrical conductor is electrically insulated from the devices for coupling microwaves. The electrical conductor has a rod-shaped design or a curved run. The electrical conductor is connected to the voltage source via a feedthrough filter. The device for coupling microwaves expands in a funnel shape toward the electrical conductor and is partially or completely filled by a dielectric material.
(Continued)

The device for coupling microwaves has groove-shaped recesses running along a circumference.

12 Claims, 6 Drawing Sheets

(51) Int. Cl.
    *H01L 21/306*  (2006.01)
    *H01J 37/32*   (2006.01)
    *C23C 16/511*  (2006.01)

(58) Field of Classification Search
    USPC ............ 118/723 MW, 715–733; 156/345.41
    See application file for complete search history.

(56) References Cited

U.S. PATENT DOCUMENTS

| | | | |
|---|---|---|---|
| 5,062,508 A | | 11/1991 | Ackermann et al. |
| 5,149,375 A | * | 9/1992 | Matsuyama ............... 118/719 |
| 5,204,272 A | * | 4/1993 | Guha .................... C23C 16/511 |
| | | | 136/258 |
| 5,270,616 A | * | 12/1993 | Itatani ..................... 315/111.21 |
| 6,831,259 B2 | * | 12/2004 | Muegge et al. ............. 219/700 |
| 6,863,773 B1 | * | 3/2005 | Emmerich et al. ...... 156/345.41 |
| 7,661,388 B2 | * | 2/2010 | Schmitt .................... 118/723 E |
| 2004/0011465 A1 | * | 1/2004 | Matsumoto et al. .... 156/345.41 |
| 2004/0244693 A1 | * | 12/2004 | Ishii et al. ........... 118/723 MW |
| 2007/0095281 A1 | * | 5/2007 | Stowell et al. ............... 118/715 |
| 2008/0011232 A1 | * | 1/2008 | Rius et al. .................... 118/733 |

FOREIGN PATENT DOCUMENTS

| | | | | |
|---|---|---|---|---|
| JP | 2002-339074 | * | 11/2002 | ......... C23C 16/505 |
| JP | 2004-047207 | * | 2/2004 | |
| JP | 2004047207 A | | 2/2004 | |

OTHER PUBLICATIONS

English Machine Translation JP 2004047207, Kamisaka et al, dated Feb. 12, 2004.*

Machine Translation JP2004047207, Kamisaka et al dt Feb. 12, 2004.*

International Search Report for corresponding International Application PCT/EP2010/066953.

* cited by examiner

DEVICE FOR GENERATING PLASMA BY MEANS OF MICROWAVES

BACKGROUND AND SUMMARY

The invention relates to a device for generating plasma by means of microwaves for CVD coating a substrate, whereby the device comprises a vacuum container into which a reaction gas can be supplied and comprises an electrical conductor arranged in it which conductor is connected to a device for coupling in microwaves.

In order to produce thin layers, coating methods based on the chemical separation of gas phases can also be used in addition to the vacuum metallizing- or sputtering techniques known from the practice. Such coating methods are also designated in the following as CVD methods (from the English: chemical vapor deposition). A solid component is separated off a heated surface of a substrate due to a chemical reaction from the gas phase. At least one gaseous starting compound and two reaction products must participate in the chemical reaction, of which at least one is present in the solid phase. A uniform coating can be achieved with CVD coating methods even in the case of complexly formed surfaces of the substrate.

The temperature load on the substrate can be reduced by a plasma-supported chemical gas-phase separation. To this end a plasma is generated, for example, with microwaves, adjacent to the substrate surface in order to excite the starting compound, customarily a reaction gas, by the plasma and to support the chemical reaction required for the coating.

In a known device for CVD coating (DE 38 30 249 C2) a large-area plasma is generated above a substrate surface to be coated by a number of devices arranged in a matrix shape for coupling in microwaves. The significant construction expense for the coupling-in devices arranged in a matrix shape that are required for being able to generate a planar plasma field that is as homogeneous as possible is viewed as a disadvantage.

A tubular external conductor is known from DE 39 26 023 C2 that is coupled via a slotted opening running axially along the external conductor to a reaction chamber in which a substrate to be coated is located. A plasma can be generated in the tubular external conductor by coupling in microwave energy in the form of microwaves impulses which plasma excites a reaction gas in the vicinity of the slotted opening of the external conductor and supports or makes possible a CVD coating of the substrate.

The previously described devices are not suited or suited only with limitations for generating a coating from an electrically conductive material on the substrate. The chemical reaction supported or started with the plasma has the result that even in the area of the components required for the generation of plasma an electrically conductive coating is separated off that can result after a brief time in a short circuit or at least can adversely affect the generation of the plasma by microwaves. As soon as a spatial separation of the plasma generated by the microwaves from the electrically conductive microwave conductors can no longer be ensured, no spatially propagating microwaves can be formed anymore so that the generation of plasma is interrupted.

Therefore, it is desirable to design a device for the generation of plasma by means of microwaves for being used for a CVD coating method of substrates in such a manner that even a coating of the substrate with electrically conductive material is possible. In addition, a linearly expanded generation of plasma that is as homogeneous as possible should be possible in order that a coating that is as uniform as possible is supported.

In an aspect of the present invention, the electrical conductor is connected on each of its two ends to a device for coupling in microwaves, that the electrical conductor is connected to a voltage source with which a potential difference can be generated between the electrical conductor and the surrounding vacuum container, and that the electrical conductor is insulated against or decoupled from the devices for coupling in microwaves.

An electrical field is generated around the electrical conductor by the potential difference of the electrical conductor opposite the vacuum container and the reaction gas located in it so the electrically charged particles are either moved toward the electrical conductor or rejected away from it. An area surrounding the electrical conductor is created in which less or hardly electrically charged particles reside, as a consequence of which the formation of the plasma is made possible or is supported. It is also conceivable to generate a rapidly changing electrical field by applying a high-frequency alternating voltage so that readily movable particles such as, for example, electrons are moved toward the electrical conductor and a zone poor in electrons is produced while heavy and immovable ions are hardly influenced by the rapidly changing electrical field. A suitable frequency range is the range of radio frequencies between 1 to 200 MHz.

The electrical and/or galvanic insulation of the electrical conductor opposite the coupling in of microwaves ensures that the generation of an electrical field around the electrical conductor does not noticeably adversely influence the generation of microwaves. Instead of an electrical and/or galvanic insulation a possibly commercially available feedthrough filter can also be provided that decouples the microwave infeed from the electrical conductor.

In the following, further embodiments and designs of the concept of the invention are presented by way of example starting from the negative potential of the electrical conductor and can be realized in an analogous manner even in the case of a positive potential of the electrical conductor or given the presence of a high-frequency alternating voltage.

Based on the negative electrical potential of the electrical conductor, electrons from a plasma generated around the electrical conductor are displaced away from the electrical conductor in the radial direction and collect at a distance given by the negative electrical potential around the electrical conductor. The electrons of the plasma that surround the electrical conductor form, together with the electrical conductor, a coaxial, electrically conductive arrangement in which the coupled-in microwaves can propagate. By means of the coupling in of the microwaves at the two ends of the electrical conductor the coupled-in microwave energy can be distributed in a largely homogeneous manner along the electrical conductor and bring about the generation of a correspondingly homogeneous plasma.

In addition, it can be achieved by the negative electrical potential of the electrical conductor that negatively charged particles or electrons are rejected and positively charged ions are accelerated toward the electrical conductor. A suitable presentation of the negative electrical potential can reduce, by the bombardment of the electrical conductor with positively charged ions generated as a result thereof, an adhesion and deposition of the ions striking the electrical conductor with a high kinetic energy and/or already deposited ions can be loosened again by the continuing ion bombardment from the electrical conductor. By presenting suitable environmental conditions and operating parameters, this can achieve a self-cleaning of the electrical conductor that prevents or at least delays a continuously increasing coating of the electrical conductor, in particular in the area of the electrically insulated housing feedthroughs and in the devices arranged in this area for coupling in microwaves. The device can then be used for long periods of time for the CVD coating of a substrate with an electrically conductive coating material without regular interruptions of the coating process being required for cleaning the components necessary for the propagation of microwaves and the generation of plasma. As a rule, a high coating rate is striven for so that only a delayed coating of the electrical conductor is brought about and its coating cannot be completely prevented.

In order to support the self-cleaning of the electrical conductor, the use of a pulsed microwave excitation can be provided that is at the same time also advantageous for many coating processes, in particular for PECVD coating processes.

Since the ion bombardment of the electrical conductor generated by the negative electrical potential causes it to be heated up, is provided that the electrical conductor is a hollow conductor that is connected to a cooling fluid reservoir. The heat generated in the electrical conductor can be reliably removed by a continuous flow through the hollow electrical conductor by a suitable cooling medium such as, for example, air or water.

An embodiment of the concept of the invention provides that the electrical conductor is shaped like a rod. A rod-shaped electrical conductor, in particular an electrical conductor shaped like a hollow cylinder, can be economically manufactured and makes possible a very homogeneous formation of the plasma along the rod-shaped electrical conductor on account of the simple geometric conditions. A generation of plasma that is expanded in a planar manner can be produced by several rod-shaped conductors arranged in parallel and at a distance from each other.

Another embodiment of the concept of the invention provides that the electrical conductor has a curved course. The curved electrical conductor can be arranged inside a substantially level surface and have, for example, a helical or meandering course. In this manner a plasma can be produced that is expanded in a planar manner and is largely homogeneous within a work area with a single electrical conductor already so that a correspondingly homogeneous coating of a substrate adapted in its dimensions to the work range can be achieved.

It is also conceivable to generate complex spatial shapes by a suitable shaping of the one curved electrical conductor or of several curved electrical conductors arranged at a distance from each other so that a largely homogeneous plasma can be generated over or along a complexly curved surface. In this manner even complexly formed substrates can be provided with a coating that is as homogeneous as possible and, for example, workpieces with concave or convex areas are provided with a uniform coating of a conductive material.

In order to prevent that the microwaves coupled in on the two ends of the electrical conductor adversely affect or disturb the negative electrical potential of the electrical conductor relative to the vacuum container, it is provided that the electrical conductor is connected via a feedthrough filter to the voltage source. The feedthrough filter can be arranged either in the area of the device for coupling in the microwaves or, however, in the area of the voltage source or in the course of the electrically conductive connection between the voltage source and the vacuum container.

It is preferably provided that the device for coupling in microwaves widens out like a funnel toward the electrical conductor. In addition, the device for coupling in microwaves can be partially or completely filled with a dielectric material in order to reduce the electrical field at the coupling in of the microwaves and to delay or check a coating with electrically conductive material in this area.

The device for coupling in microwaves can have an outer contour in the shape of a truncated cone or preferably of a horn and with a curved, radially symmetric outer surface.

It is preferably provided that the device for coupling in microwaves has slotted or groove-shaped recesses. The slotted or groove-shaped recesses or notches can be arranged in the radial direction or at an angle to it along closed circumferential lines. A continuous coating with electrically conductive material and the formation of closed, electrically conductive paths over the surface of the device for coupling in microwaves is at least delayed by the surface that is distinctly enlarged in this manner.

It is also conceivable and, with regard to the electrical insulation of the electrical conductor relative to the vacuum housing and the coupling in of microwaves, advantageous that the slotted or groove-shaped recesses are arranged surrounding the electrical conductor in the axial direction. In particular in the case of a concentric arrangement of slotted recesses extending along the electrical conductor and surrounding it a substantially total shading of the slotted recesses takes place in a transitional area to the electrical conductor so that for this reason no continuous coating takes place in this area or only a greatly reduced coating takes place and an electrically conductive connection of the electrical conductor to the housing wall can be significantly delayed or completely prevented in the framework of customary maintenance intervals.

According to an especially advantageous embodiment of the concept of the invention it is provided that the device for coupling in microwave widens out substantially inside the vacuum container. In the area of the housing wall of the vacuum container the device for coupling in microwaves has a comparatively small diameter or a small cross-sectional area so that commercially obtainable sealing devices or sealing components can be used for the pressure density and the electrically insulated fastening of the electrical conductor and of the surrounding device for coupling in microwaves.

BRIEF DESCRIPTION OF THE DRAWINGS

Various embodiments of the concept of the invention are explained in detail in the following that are shown in the drawings, in which.

DETAILED DESCRIPTION

Figure 1:
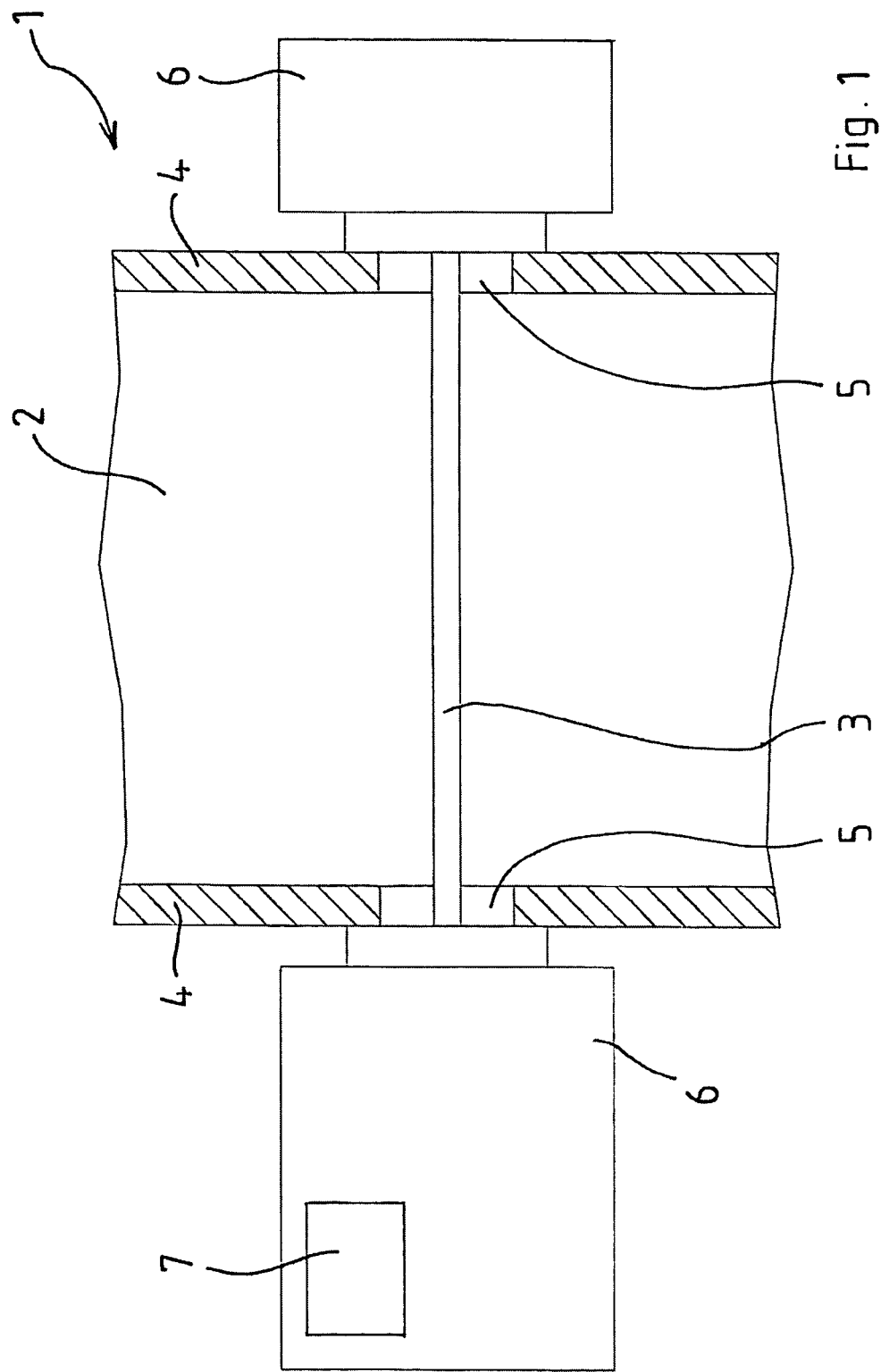
FIG. 1 shows a schematic view of a device for the generation of plasma by means of microwaves with a vacuum container and with an electrical conductor arranged in it.

FIG. 1 shows a device 1 in accordance with the invention for generating plasma by means of microwaves that is suitable for being used in the CVD coating of a substrate with in particular electrically conductive materials. The device 1 comprises a vacuum container 2 in which an electrical conductor 3 is arranged between two opposite housing walls 4 of the vacuum container 2. The electrical conductor 3 can consist of or comprise conductive or semi-conductive material. The electrical conductor 3 is electrically insulated by suitable sealing elements 5 and is fastened in a pressure-tight manner on the two housing walls 4.

The electrical conductor 3 is connected on each of its two ends to a device for coupling in microwaves 6. Microwaves can be coupled in on both sides of the electrical conductor 3 via the devices for the coupling in the microwaves 6. The coupling in can take place independently of one another but preferably synchronized in a suitable manner.

The electrical conductor 3 is additionally connected to a voltage source 7 that can bring the electrical conductor 3 to a negative electrical potential relative to the advantageously grounded vacuum container 2. The bias voltage required for this can be, for example, between 10 V and 1000 V. Based on the electrical insulation of the electrical conductor 3 by the sealing elements 5, it is ensured that the devices for coupling in the microwaves 6 and the supplying microwave conductors do not have negative electrical potential.

If a suitable vacuum is produced in the vacuum container 2 and microwaves are fed in via the devices for the coupling in of microwaves 6, a plasma is produced in the surroundings of the electrical conductor 3. By means of the bias voltage present on the electrical conductor 3 a constant electrical field is produced in which the electrons and negatively charged particles are displaced radially outward from the electrical conductor 3. The readily movable electrons of the plasma produced by the microwaves collect at a distance from the electrical conductor 3, that is substantially given by the negative electrical potential of the electrical conductor 3 and form a casing surrounding the electrical conductor 3.

It can be achieved by suitably setting the boundary conditions such as, for example, the vacuum, the bias voltage and the coupled-in microwave energy that this coaxial arrangement of the electrical conductor 3 and of the electron casing surrounding this electrical conductor 3 favors the propagation of microwave so that finally surface waves are produced along the electrical conductor 3 and a homogeneous distribution of energy of the coupled-in microwave energy can be achieved. The homogeneous propagation of microwaves results in a correspondingly homogeneous production and maintaining of the plasma produced in the vacuum container 2.

A reaction gas can be supplied to the vacuum container 2 via supply devices that are not shown. The reaction gas is excited by the plasma so that a separation of the desired coating material is forced. The coating material is precipitated, among other things, onto a substrate surface that is also not shown and brings about a continuously growing coating of the substrate with the coating material.

Even semi-conductive or conductive layers can be produced with the previously described plasma CVD coating method. The electrical field generated around the electrical conductor 3 results in that positively charged ions are accelerated toward the electrical conductor 3 and strike with corresponding kinetic energy onto the electrical conductor 3. As a result of this ion bombardment a self-cleaning of the electrical conductor 3 is brought about. In order to counteract a heating up of the electrical conductor 3, it can be provided that the electrical conductor 3 is constructed as a hollow conductor and is connected at its ends to a cooling agent circuit so that an effective cooling of the electrical conductor 3 can be ensured by circulating the cooling agent.

Figure 2:
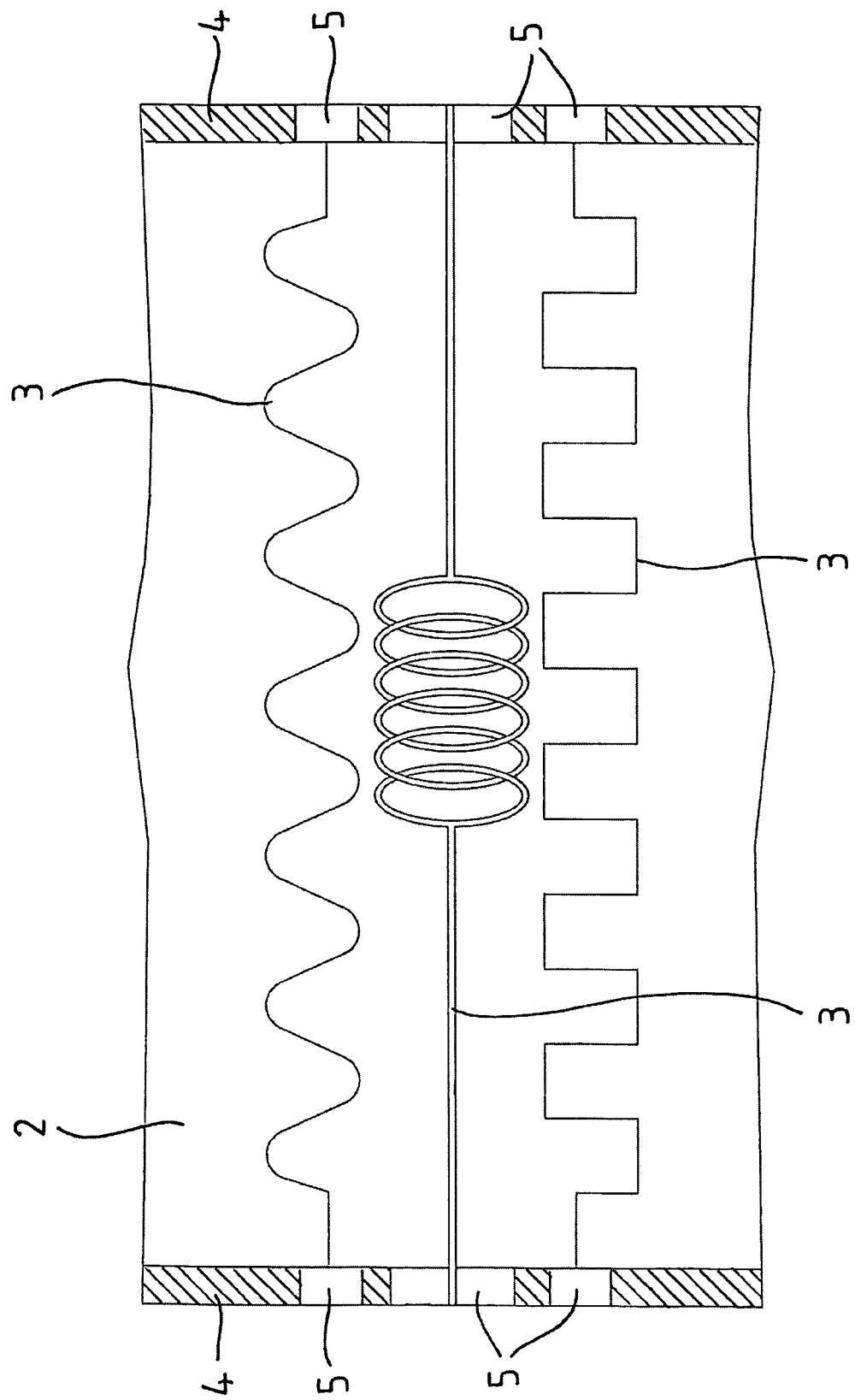
FIG. 2 shows by way of example various planar or three-dimensional shapes of the electrical conductor that is illustrated only schematically between opposite housing walls of the vacuum container.
Figure 3:
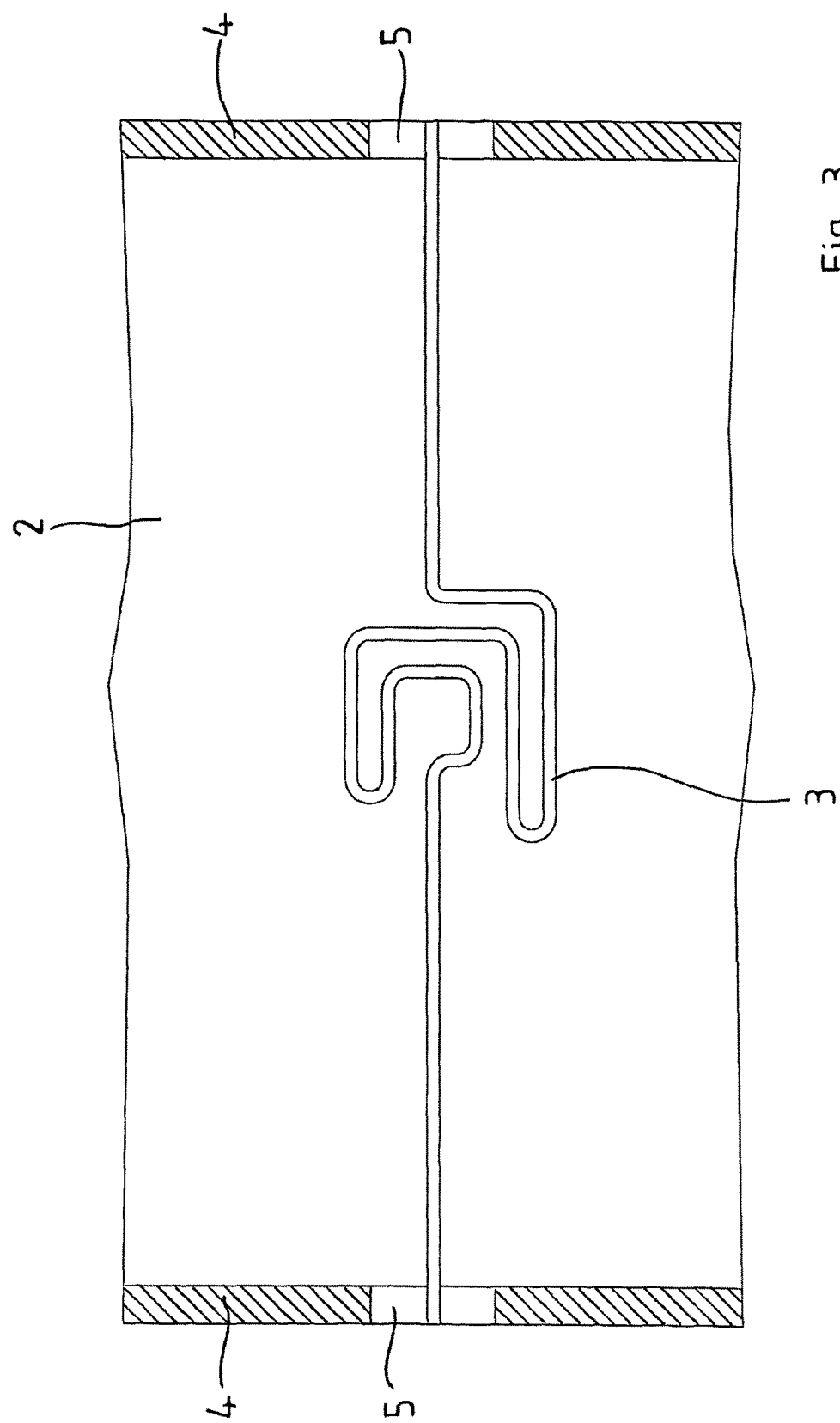
FIG. 3 shows a schematic view of an approximately helical course of the electrical conductor.

The electrical conductor 3 can be constructed as a rod-shaped electrical conductor 3 in accordance with the exemplary embodiment shown in FIG. 1. It is also conceivable that the electrical conductor 3 can have a meandering or a helical course and thus have a planar or spatial extension by means of which a corresponding planar or spatial propagation of the plasma generated around the electrical conductor 3 can be given. FIG. 2 schematically shows a few exemplary embodiments by way of example. FIG. 3 shows a design of the electrical conductor 3 with a planar, substantially helical course. In this manner a comparatively homogeneous plasma can be generated with simple constructive means in a work area that is adapted to the dimensions of the helically formed area of the electrical conductor 3 so that a uniform coating of a substrate arranged at a distance from the electrical conductor 3 becomes possible.

Figure 4:
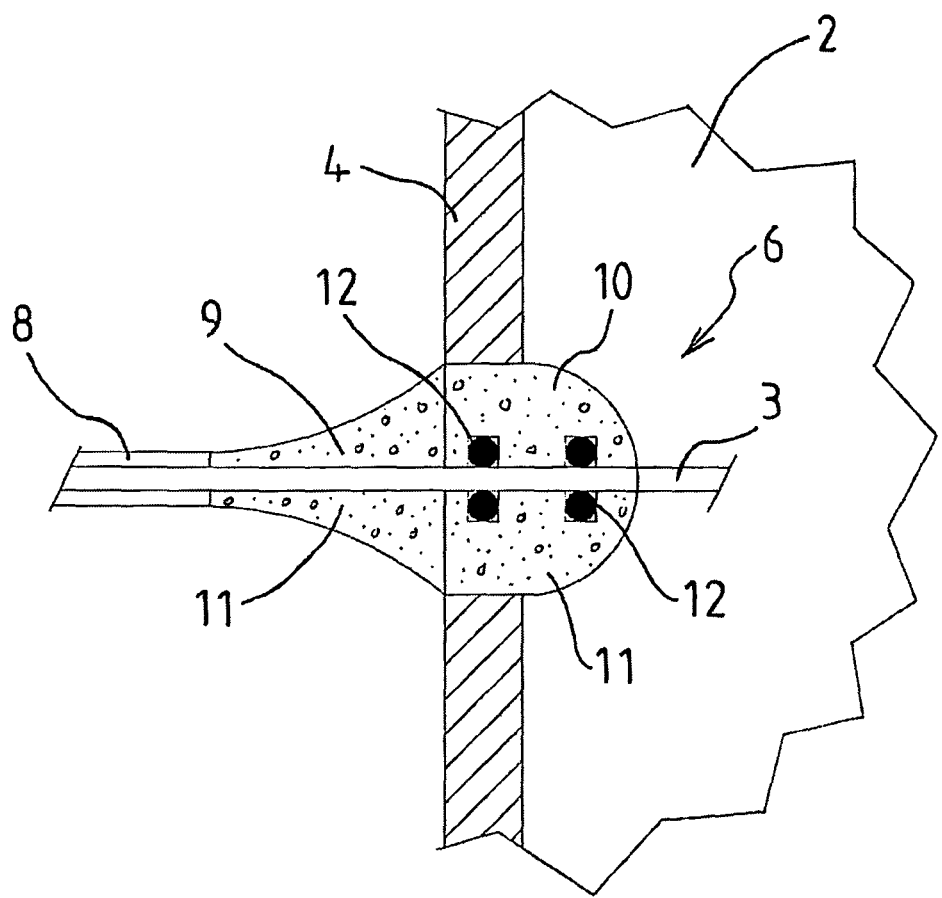
FIG. 4 shows a schematic view of a device arranged in the area of a housing wall of the vacuum container and for coupling in microwaves which device surrounds the concentrically arranged electrical conductor in an electrically insulated manner.
Figure 5:
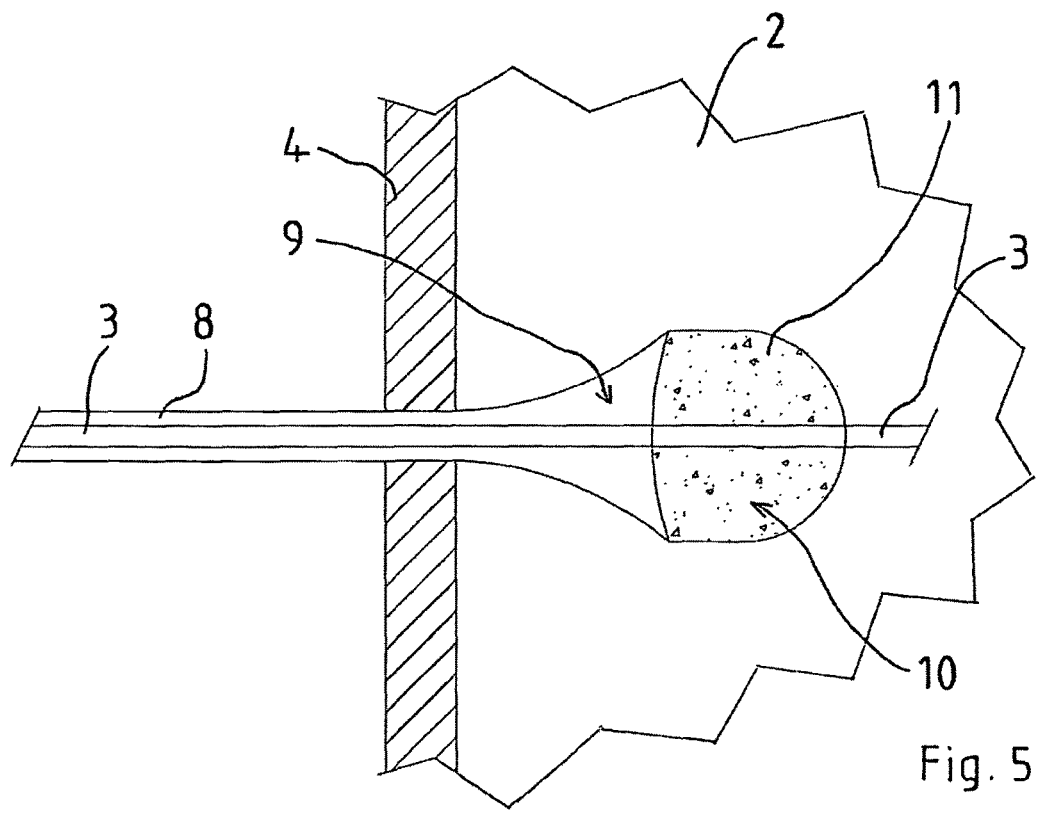
FIG. 5 shows a deviating embodiment of the device shown in FIG. 4 for coupling in microwaves, FIG. 6 again shows a deviating embodiment of a device for coupling in microwaves.
Figure 6:
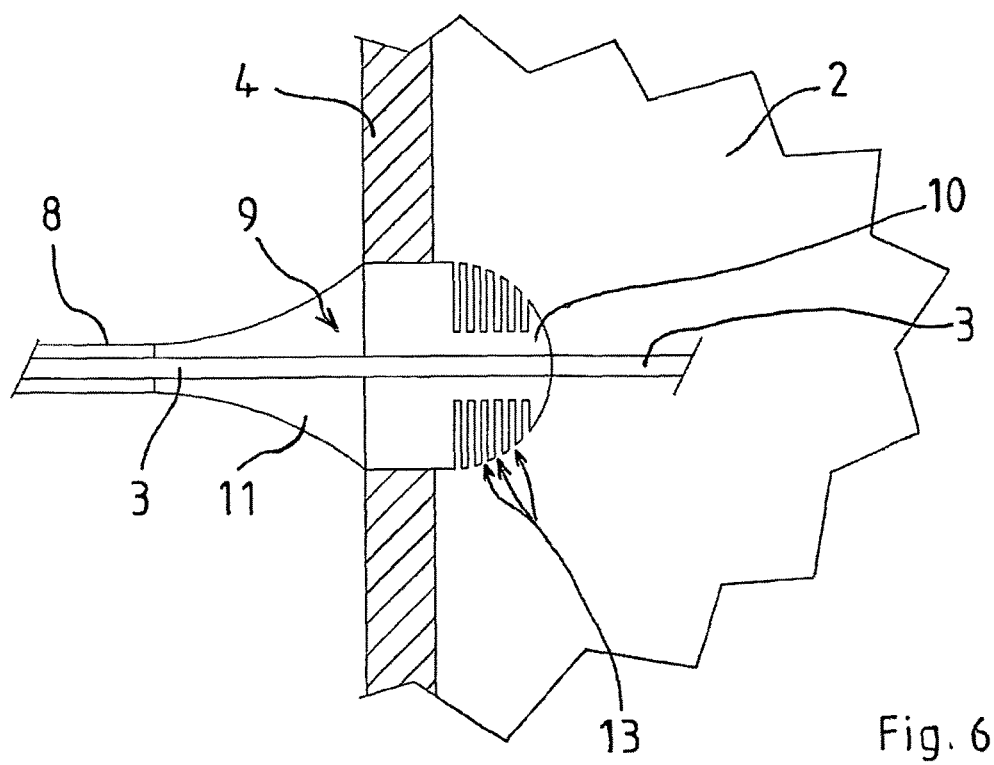

FIGS. 4 to 6 show different embodiments of the device for coupling in the microwave 6 by way of example.

In the device 6 shown in FIG. 4 an outer conductor 8 surrounding the electrical conductor 3 and for the microwaves to be coupled in is widened out in a funnel-like manner outside of the vacuum container 2. A suitable dielectric material 11 is located in an area 9 that enlarges in a funnel-like manner and in a rounded-off closure area 10 of the device for the coupling in of microwaves 6. The feedthrough of the electrical conductor 3 is additionally sealed via vacuum seals 12.

The funnel-shaped widening out of the outside conductor 8 and the dialectic material 11 located in it results in a local weakening of the microwave field so that a generation of plasma is significantly reduced in the area around the device for the coupling in of the microwaves 6. In this manner it can be avoided or at least delayed that in the case of an electrically conductive coating material a rapid coating takes place at the coupling-in position that could lead to a short circuit and interrupt the generation of plasma.

In the exemplary embodiment shown in FIG. 5 the funnel-shaped widening of the outside conductor 8 of the device for coupling in the microwaves 6 was moved into an inner chamber of the vacuum container 2 so that the outside conductor 8 has a small diameter during the feedthrough through the housing wall 4 of the vacuum container 2 and commercially available sealing elements that are not shown in detail in this illustration can be used for the pressure-tight and electrically insulating sealing of the coaxial feed of the electrical conductor 3 and of the surrounding outside conductor 8.

In the exemplary embodiment shown in FIG. 6 the closure area 10 additionally comprises annularly designed, groove-shaped recesses 13 that render a continuous coating difficult on account of the significantly enlarged surface and in the case of an electrically conductive coating material prevent or at least delay the formation of closed, conductive paths.

Figure 7:
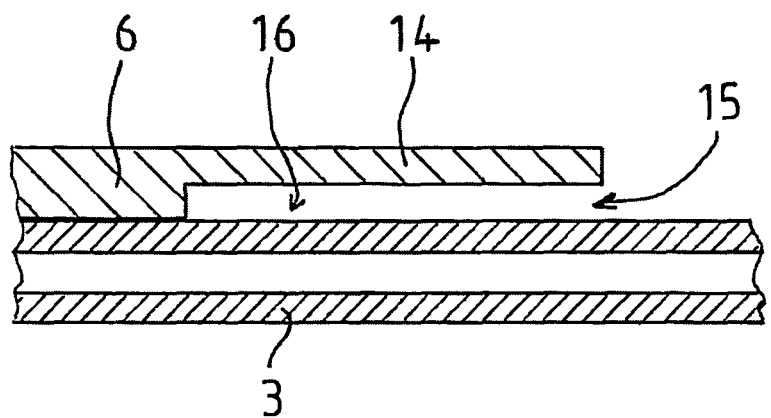
FIG. 7 shows another embodiment of a device for coupling in microwaves in an enlarged and sectional view.
Figure 8:
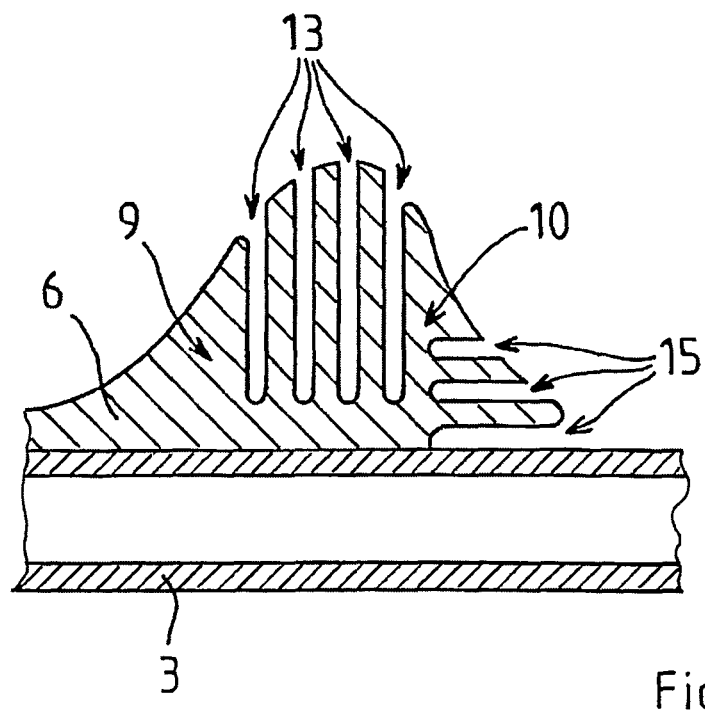
FIG. 8 shows another embodiment of a device for coupling in microwaves in a view comparable to FIG. 7.

FIGS. 7 and 8 show two other embodiments of the device surrounding the electrical conductor 3 and for the coupling in of microwaves 6 enlarged in a sectional view in the transitional area to the electrical conductor 3, that is hollow on the inside and through which a cooling medium can flow. The construction shown in FIG. 7 has, instead of an area 9 that at first enlarges like a funnel and instead of a rounded-off closure area 10, a hollow cylindrical end area 14 surrounding the electrical conductor 3 at a distance. A concentrically arranged slotted recess 15 surrounding the electrical conductor 3 in the insulating, dielectric material 11 is located between the hollow cylindrical end area 14 and the electrical conductor 3. Only a clearly reduced coating takes place in an inner area 16 of the slotted recess 15.

The design of the device for coupling in microwaves 6 that is shown in FIG. 8 comprises a slotted recess 13 running along a circumferential line as well as comprises concentrically arranged, slotted recesses 15 surrounding the electrical conductor 3. The surface of the device for coupling in microwaves 6, which surface is greatly enlarged in this manner, results in a correspondingly delayed formation of a coating in this area that could make possible an electrical conductive connection between the electrical conductor 3 and the housing wall located on the left and not shown in the FIGS. 7 and 8.

The invention claimed is:

1. A device for generating plasma by means of microwaves for CVD coating a substrate, comprising
   a vacuum container into which a reaction gas can be supplied, and
   an electrical conductor arranged in the vacuum container, which conductor is connected to a device for coupling in microwaves, wherein the electrical conductor has two ends and is connected on each of its two ends to a device for coupling in microwaves, the electrical conductor being connected to a voltage source with which a potential difference can be generated between the electrical conductor and the surrounding vacuum container, the electrical conductor is insulated against or decoupled from the devices for coupling in microwaves, wherein the electrical conductor is in direct contact with the reaction gas in the vacuum container, and wherein a coating material used for coating the substrate differs from a material from which the electrical conductor is formed.

2. The device according to claim 1, wherein the electrical conductor is a hollow conductor that s connected to a cooling fluid reservoir.

3. The device according to claim 1, wherein the electrical conductor has a rod-shaped shape.

4. The device according to claim 1, wherein the electrical conductor has a curved course.

5. The device according, to claim 1, wherein the electrical conductor is connected via a feedthrough filter to the voltage source.

6. The device according to claim 1, wherein the device for coupling in microwaves widens out like a funnel toward the electrical conductor.

7. The device according to claim 6, wherein the device for coupling in microwaves widens out substantially inside the vacuum container.

8. The device according to claim 1, wherein the device for coupling in microwaves is partially or completely filled with a dielectric material.

9. The device according to claim 1, wherein that the device for coupling in microwaves has slotted or groove-shaped recesses.

10. The device according to claim 9, wherein the slotted or groove-shaped recesses are arranged surrounding the electrical conductor in the axial direction.

11. The device according to claim 1, wherein the electrical conductor has a negative potential or positive potential relative to the surrounding vacuum container.

12. The device according to claim 1, wherein the electrical conductor can be loaded with a high-frequency alternating voltage.

* * * * *